United States Patent
Billiet

(10) Patent No.: US 10,457,081 B2
(45) Date of Patent: Oct. 29, 2019

(54) ADDITIVE MANUFACTURING METHOD USING DYNAMIC LIGHT PROJECTION FOR FLEXOGRAPHIC PRINT MASTERS

(71) Applicant: AGFA NV, Mortsel (BE)

(72) Inventor: Thomas Billiet, Mortsel (BE)

(73) Assignee: AGFA NV, Mortsel (BE)

(*) Notice: Subject to any disclaimer, the term of this patent is extended or adjusted under 35 U.S.C. 154(b) by 0 days.

(21) Appl. No.: 16/061,024

(22) PCT Filed: Dec. 1, 2016

(86) PCT No.: PCT/EP2016/079431
§ 371 (c)(1),
(2) Date: Jun. 11, 2018

(87) PCT Pub. No.: WO2017/102353
PCT Pub. Date: Jun. 22, 2017

(65) Prior Publication Data
US 2018/0361773 A1 Dec. 20, 2018

(30) Foreign Application Priority Data
Dec. 15, 2015 (EP) ..................................... 15200097

(51) Int. Cl.
| *B41N 1/12* | (2006.01) |
| *B41C 1/00* | (2006.01) |
| *G03F 7/00* | (2006.01) |
| *B33Y 80/00* | (2015.01) |
| *B33Y 70/00* | (2015.01) |
| *B33Y 10/00* | (2015.01) |
| *B33Y 30/00* | (2015.01) |
| *B29C 64/124* | (2017.01) |
| *B29C 64/135* | (2017.01) |

(Continued)

(52) U.S. Cl.
CPC .............. *B41N 1/12* (2013.01); *B29C 64/124* (2017.08); *B29C 64/129* (2017.08); *B29C 64/135* (2017.08); *B29C 64/20* (2017.08); *B33Y 10/00* (2014.12); *B33Y 30/00* (2014.12); *B33Y 70/00* (2014.12); *B33Y 80/00* (2014.12); *B41C 1/00* (2013.01); *G03F 7/0037* (2013.01); *B41C 1/003* (2013.01)

(58) Field of Classification Search
None
See application file for complete search history.

(56) References Cited

U.S. PATENT DOCUMENTS

| 5,049,901 A | 9/1991 | Gelbart |
| 2002/0012110 A1 | 1/2002 | Luellau et al. |

(Continued)

FOREIGN PATENT DOCUMENTS

| DE | 101 59 084 A1 | 6/2003 |
| EP | 0 414 215 A2 | 2/1991 |

(Continued)

OTHER PUBLICATIONS official Communication issued in International Patent Application No. PCT/EP2016/079431, dated Jan. 16, 2017.

*Primary Examiner* — Joshua D Zimmerman
(74) *Attorney, Agent, or Firm* — Keating and Bennett, LLP

(57) ABSTRACT

A method for reconstructing a relief print master with a three-dimensional printer includes introducing cavities inside the relief print master in order to control its compressibility.

15 Claims, 13 Drawing Sheets

(51) Int. Cl.
*B29C 64/129* (2017.01)
*B29C 64/20* (2017.01)

(56) References Cited

U.S. PATENT DOCUMENTS

2005/0248062 A1  11/2005  Shkolnik et al.
2006/0084008 A1   4/2006  Long et al.

FOREIGN PATENT DOCUMENTS

| EP | 0 535 720 A2 | 4/1993 | |
|----|---|---|---|
| EP | 0 549 993 A1 | 7/1993 | |
| EP | 0 950 212 B1 | 3/2002 | |
| EP | 2 199 066 A1 | 6/2010 | |
| EP | 2 266 781 A1 | 12/2010 | |
| EP | 2 537 675 A1 | 12/2012 | |
| WO | 99/50711 A1 | 10/1999 | |
| WO | 2007/106489 A1 | 9/2007 | |
| WO | WO-2013060375 A1 * | 5/2013 | ............. B41C 1/003 |

* cited by examiner

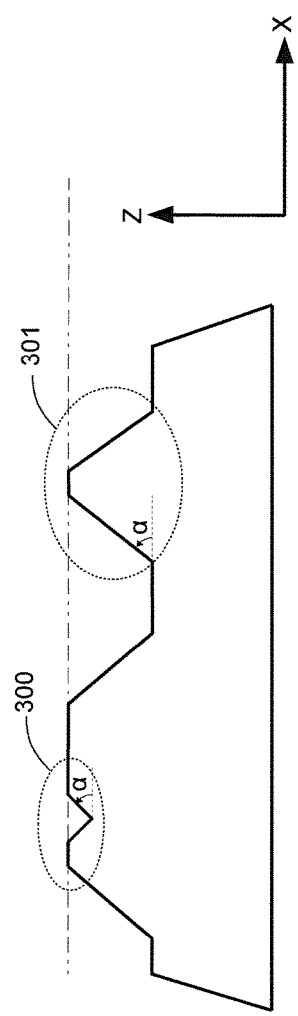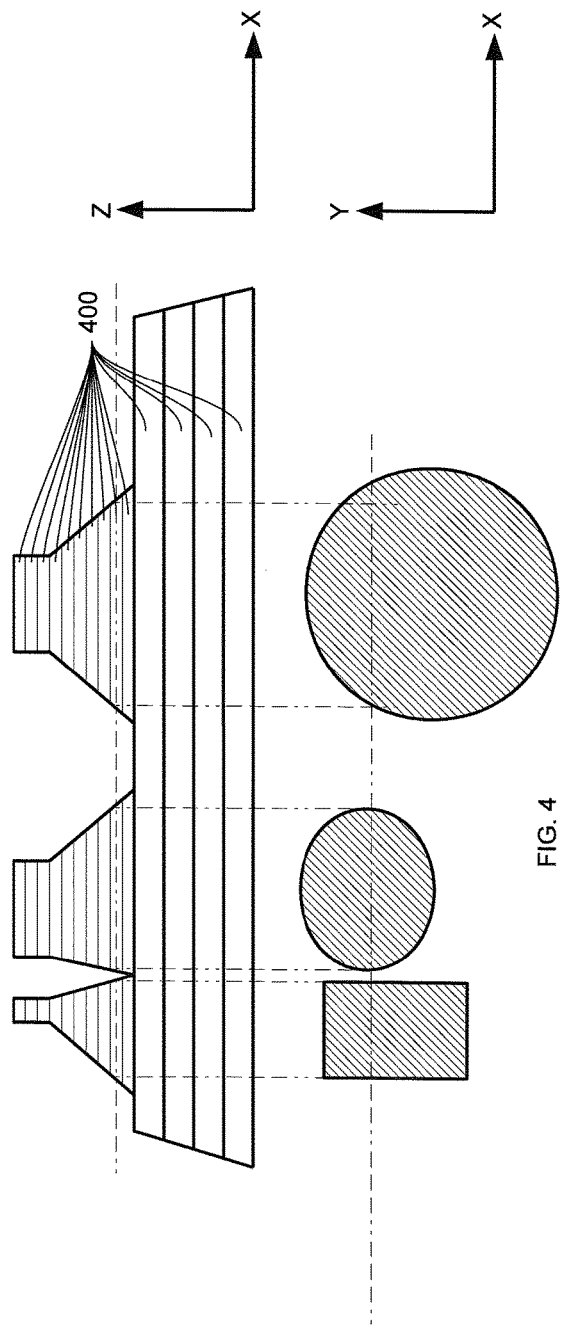

ADDITIVE MANUFACTURING METHOD USING DYNAMIC LIGHT PROJECTION FOR FLEXOGRAPHIC PRINT MASTERS

CROSS REFERENCE TO RELATED APPLICATIONS

This application is a 371 National Stage Application of PCT/EP2016/079431, filed Dec. 1, 2016. This application claims the benefit of European Application No. 15200097.2, filed Dec. 15, 2015, which is incorporated by reference herein in its entirety.

BACKGROUND OF THE INVENTION

1. Field of the Invention

The current invention belongs to the field of printing three-dimensional objects by means of rapid manufacturing and prototyping by means of the additive depositing of material. More specifically, the current invention belongs to the field of using such techniques for creating a relief print master such as a flexographic print master.

2. Description of the Related Art

In flexographic printing a flexible cylindrical relief print master is used for transferring a fast drying ink from an anilox roller to a printable substrate. The print master can be a flexible plate that is mounted on a cylinder or it can be a cylindrical sleeve.

The raised portions (200, 201, 202) of the relief print master in FIG. 2 define the image features (100, 101, 102) in FIG. 1 that are to be printed.

Because the flexographic print master has elastic properties, the process is particularly suitable for printing on a wide range of printable substrates including for example corrugated fiberboard, plastic films or even metal sheets.

A traditional method for creating a print master uses a photosensitive polymerizable sheet that is exposed by a UV radiation source through a negative film or a negative laser ablated mask layer (EP 1170121 B (AGFA GEVAERT NV) 26 Jun. 2002) that defines the image features. Under the influence of the UV radiation, the sheet will polymerize underneath the transparent portions of the film. The remaining portions are washed away and what remains is a positive relief printing plate.

The above method suffers from a number of drawbacks. It requires an extensive series of processing steps such as preparing the mask layer (which by itself includes a number of steps), exposing the polymerizable sheet and washing away the non-polymerized elements. Moreover, it offers little control over the final result and more specifically over the slope of the image features that are formed onto the print master. This slope ($\alpha$) is an important feature as is demonstrated in FIG. 3. The slope ($\alpha$) of a small image feature (301) (such as a small halftone dot or a narrow character stem) is preferably not too steep because this would cause the image feature to buckle during printing, resulting in the loss of rendering of small "positive" image detail. On the other hand the slope ($\alpha$) should not be too shallow as this would cause the space between two closely neighbouring image features (300) to fill up, resulting in the loss of rendering of small "negative" image detail.

A three-dimensional printing technique for forming a flexographic print master is disclosed in EP 1428666 B (AGFA GRAPHICS NV) 11 Dec. 2002. According to this method an inkjet printing system is used for jetting on a substrate at least two image-wise layers of a polymerizable fluid. After a first layer has been jetted, it is immobilized ("cured") before the subsequent layer is applied. The immobilisation is achieved by means of UV-light. Because according to this method the flexographic printing master is build up layer by layer, it is at least theoretically possible to control the slope of the image features in a different way for positive or for negative image features using image processing. Small positive features could receive a soft slope, whereas small negative features on the contrary could receive a steep slope. One of the problems with the above method, however, is that it is difficult to control the exact shape and thickness of the layers that are formed by jetting UV-curable ink droplets with a print head. This is related to a variety of factors such as surface tension effects and the round (as opposed to "cubic") shape of the droplets when they land onto the printable surface. These effects tend to accumulate layer by layer and the result is that the top layer of the image features does not lie in a perfect plane as would be ideal for a flexographic print master. Having not all the top layers in the same plane causes uneven pressure between the print master and the printable substrate on the rotary press, resulting in uneven transfer of the ink and serious degradation of the quality of the printed image.

Another method is disclosed in EP 2199066 B (AGFA GRAPHICS NV) 19 Dec. 2008. According to this publication multiple layers of a flexographic print master on a drum are simultaneously printed during a single cycle by different nozzles of the same print head. The advantage over the previous method is that the result is a print sleeve that is directly suitable for mounting on a rotary printing press and that print masters can be created that are 360° seamless. However, given that the print master is build up using a similar additive process of jetting UV-curable ink droplets to form additive layers as in the previous publication, the method suffers from the same deficiency that the top layers doe not lie in a perfect cylindrical plane.

U.S. Pat. No. 5,049,901 B (CREO PRODUCTS INC) 2 Jul. 1990 introduces the use of a two-dimensional array of digital micro-mirrors for the purpose of exposing a print plate precursor. An imaging unit comprises a light source such as an arc lamp and a collimation lens in combination with a two-dimensional array of digital micro-mirrors and a projection lens. The imaging unit moves in a linear fashion relative to a light-sensitive printing plate precursor and exposes its surface in response to the pixels of a binary bitmap that defines the image that is to be printed by the print plate. According to the invention, each location on the recording surface is exposed multiple times by distinct rows of the digital micro-mirror device while the latter scans the surface. The invention reduces the requirements for the power of the light source by taking advantage of the relatively large area of the two-dimensional digital micro-mirror device as opposed to the case when a only single row of micro mirrors would be used.

EP 0950212 B (FRIEDRICH LÜLLAU) 31 Dec. 1996 teaches that before exposing a light-sensitive surface, a binary bitmap is first broken down along the two dimensions into a set of contiguous rectangular partial bitmaps. A partial bitmap is exposed onto a light-sensitive printing plate precursor using an imaging unit that comprises a light source and a collimation lens in combination with a two dimensional light modulator such as an LCD panel, and a projection lens. The complete image is reconstructed by moving the imaging unit stepwise over the light-sensitive surface and each time exposing the corresponding partial bitmap.

Three-dimensional printing is a method for creating three-dimensional objects by depositing or forming thin layers of material in succession on top of each other so as to build up the desired three-dimensional structure. It is sometimes called "Rapid Prototyping and Manufacturing" (RP&M).

Various methods have been devised to create the thin layers, not all of them will be presented here.

EP 0535720 B (UVP, INC.) 8 Aug. 1984 discloses a system and a method that uses a vat containing polymerizable liquid material. A thin upper layer of the liquid is selectively cross-linked or hardened using for example a scanning spot of UV-light or a laser beam so that a solidified layer is formed that exactly corresponds with the shape of a cross-section of the three-dimensional object that is to be formed. After one layer is completed, the liquid level is raised over a small distance (or alternatively the fabrication platform on which the object rests is lowered) and the process is repeated. Each polymerized layer should be sufficiently form-stable to support the next layers.

An alternative method exposes the vat with polymerizable liquid from underneath through a transparent bottom. When a layer is exposed, the fabrication platform is moved upwards. An advantage of the latter approach is that level with polymerizable liquid material in the vat can remain constant and very shallow. This reduces the risk of chemical or physical degradation of a large volume of polymerizable liquid material in the vat.

EP 0549993 B (TEXAS INSTRUMENTS INCORPORATED) 30 Dec. 1991 discloses the use of a projection system based on a two-dimensional array of deformable micro-mirrors for exposing the layers in one of the above systems.

EP 2266781 B (ENVISIONTEC GMBH) 10 May 2004 provides a process for the production of a three-dimensional object using illumination through a digital mask, wherein the mask uses a two-dimensional array of light valves (such as an LCD-panel) having a specific resolution. The improvement of the invention is to double (or more) the resolution of the system by exposing a layer in four (or more) steps, whereby the mask is shifted in both the x and y dimensions over the distance half (or less) the size of a pixel.

The same publication also discloses the use of LCD panels for selectively exposing a layer.

More information on rapid prototyping, three-dimensional printing, additive fabrication, tooling, and rapid manufacturing is also found in the Wohlers Report 2008, edited and published by Wohlers Associates, Inc., OakRidge Business Park 1511 River Oak Drive in Fort Collins, Colo. 80525 USA.

Unresolved Problems

An important aspect of a relief print master is its physical compressibility. The optimal degree of compressibility of a print master depends on many factors such as the speed at which the rotary press runs, the physical properties of the substratum on which is printed, the thickness of the relief print master, its elasticity etc. Additionally the image features themselves dictate an optimum degree of compressibility. For example image features that contain high frequency halftones require a lesser degree of compressibility than large solid image features.

In the industry different solutions are available to control the compressibility. The company Roger Corporation located in Rogers, Conn. offers cushion mounting materials marketed under the trade name R/Bak® that are mounted between the rotary cylinder and the relief print master. Another solution is offered by the company FlintGroup in Luxembourg. Their Rotec® Compressible Sleeve has built-in features to optimize the compressibility. In both cases the compressibility is achieved by introducing during the manufacturing gas bubbles trapped inside the cushion mounting material or the sleeve.

The existing solutions to control compressibility are not optimal, because do not provide a means for control compressibility locally, i.e. depending on the image features that are to be printed.

There is a need for an improved method for controlling the compressibility of a relief print master or a sleeve depending on the physical properties of the printable substrate, the speed of the rotary press, the desired run-length and print quality, the thickness of the relief print master and its elasticity. More specifically there is a need for controlling the compressibility of a relief printing sleeve locally, as a function of one or more parameters that are representative for image features such as their size or the presence of halftone images.

SUMMARY OF THE INVENTION

Accordingly it is a subject of the invention to create an improved relief print master of which the compressibility can be controlled. Additionally it is a subject of the invention that the compressibility of the plate can be locally controlled, for example as a function of specific image features.

BRIEF DESCRIPTION OF THE DRAWINGS

FIG. 3 shows a cross section in the X-Z plane of a relief print master.

FIG. 4 shows a cross section in the X-Z plane of a relief print master that is constructed by stacking layers on top of each other.

DETAILED DESCRIPTION OF THE PREFERRED EMBODIMENTS

Calculation of a Three-Dimensional Model of the Relief Print Master

Figure 2:
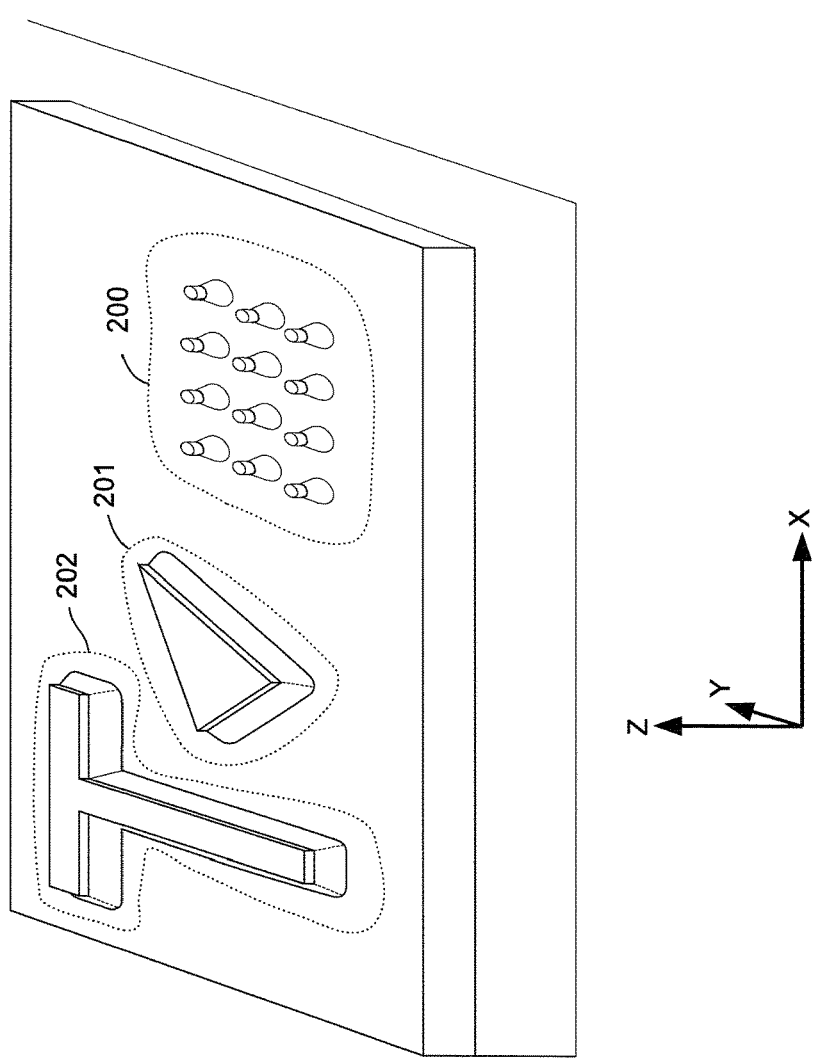
FIG. 2 shows a rendering of a relief print master for printing images having different image features.
Figure 1:
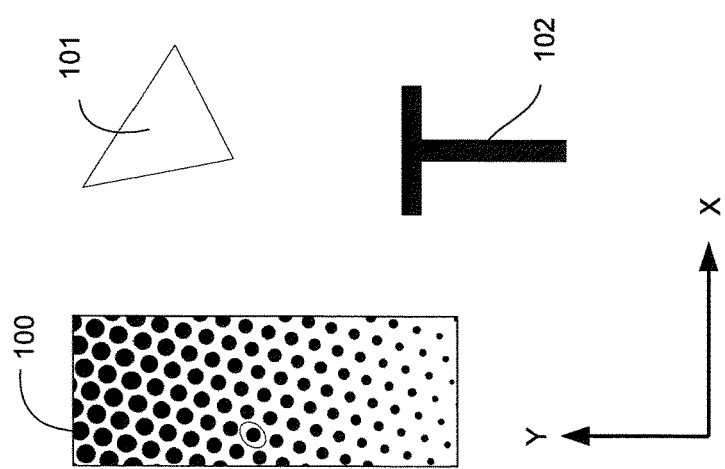
FIG. 1 shows examples of images having different image features.

FIG. 1 shows a two-dimensional image in the X-Y dimensions of which a relief print master is to be created. It comprises a halftone part (100) for rendering a picture, a geometrical shape (101) and a text part (102). FIG. 2 shows a rendering of the relief print master the halftone part (200) for rendering a picture, a geometrical shape (201) and a text part (202) raised in the Z dimension.

According to any of the preferred embodiments in this document, a first step comprises the conversion of a binary two-dimensional source image into a three-dimensional model of the relief print plate that is to be created. Such a three-dimensional representation consists of "voxels" the value of which indicate where during the reconstruction of the relief print master material is preserved and where not.

EP 1437882 A (AGFA GRAPHICS NV) 11 Dec. 2002 discloses a first method to obtain such a representation. It makes use of a topographic operator to convert the binary two-dimensional source image representing the image features including, text, graphics and images into a three-dimensional image of a flexographic print master that is suitable for reconstruction.

EP 2199065 B (AGFA GRAPHICS NV) 19 Dec. 2008 discloses an alternative technique for the same purpose. It equally starts from the binary two-dimensional source image that corresponds to the top layer of the flexographic print master and next uses a circular spread function for calculating subsequently lower layers.

In both techniques, the result is an ordered stack of binary two-dimensional images that together define a three dimensional representation of the print master that is suitable for reconstruction in a three-dimensional printer. During the reconstruction of the relief print master, each one of the ordered stack of two-dimensional layers will be converted into a thin layer. When the thin layers (400) are stacked (FIG. 4) in the same order as the two-dimensional images in the three-dimensional model, they together constitute the relief print master.

Stereolitography

Figure 5:
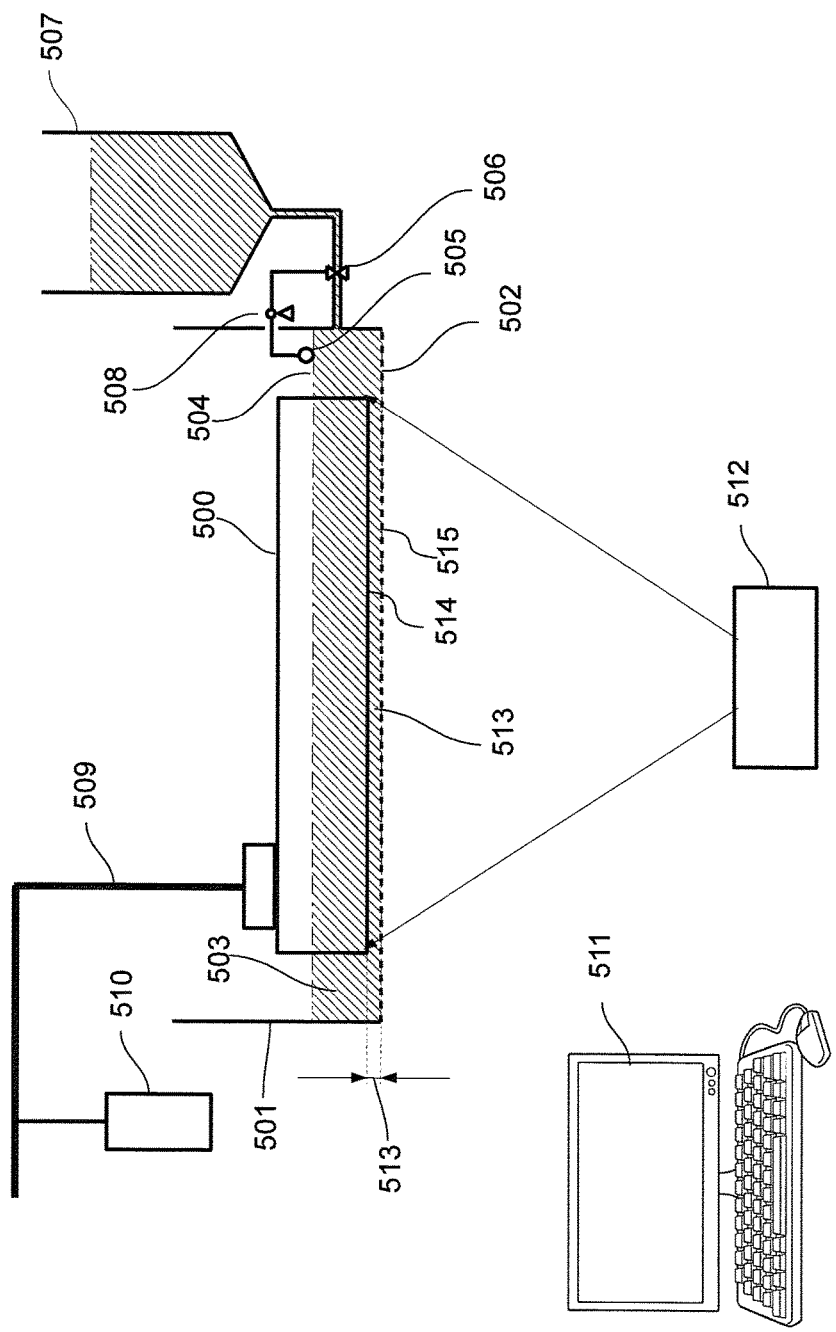
FIG. 5 shows a first system that is suitable for three-dimensional printing.

FIG. 5 shows a first embodiment of a stereolithographic apparatus and a method for creating the relief print master. A manufacturing platform (500) resides in a vat (501) with a transparent bottom (502). The vat (501) is filled with a photocurable liquid (503). The level (504) of the photocurable liquid (503) is kept constant by means of a sensor (505), a valve (506) that connects the vat (501) to a supply tank (507) filled with photocurable liquid and a control system (508) to control the valve in order to keep the level (504) in the vat (501) constant.

The manufacturing platform (500) is connected by means of a lever (509) to a motor (510) and a worm drive that is capable to move the platform upwards in the direction of the Z-dimension. The motor is controlled by a computing device (511).

Below the transparent bottom (502) of the vat (501) is an illumination system (512) that projects a two-dimensional image on the photocurable liquid layer (513) underneath the manufacturing platform (500).

The operation of the device is as follows. At the beginning the manufacturing platform (500) is lowered to an initial state, leaving a distance (513) between the bottom (514) of the manufacturing platform (500) and the upper surface (515) of the transparent plate (502) of approximately between 1.0 mm and 2.0 mm. A first two-dimensional layer (513) is created by illuminating the lowest of the ordered stack of two-dimensional images onto the layer of photocurable liquid between the manufacturing platform (500) and the upper surface (514) of the transparent bottom plate. During this process, the photocurable liquid polymerizes selectively in response to the information contained in the two-dimensional image.

In a next step the manufacturing table (500) is raised by the motor (510) in the Z-dimension so that the distance (513) between the layer that was formed in the previous step and platform (500) and the upper surface (515) of the transparent plate (502) is again approximately between 1.0 mm and 2.0 mm. This is followed by exposing the photocurable liquid in response to the second lowest of the ordered stack of two-dimensional images so that a second layer is formed that adheres to the previous layer.

This process is repeated until the complete ordered set of layers has been formed at which point the relief print master is finished.

In a next and final step, the manufacturing platform is raised and the relief print master is detached from it.

Figure 6:
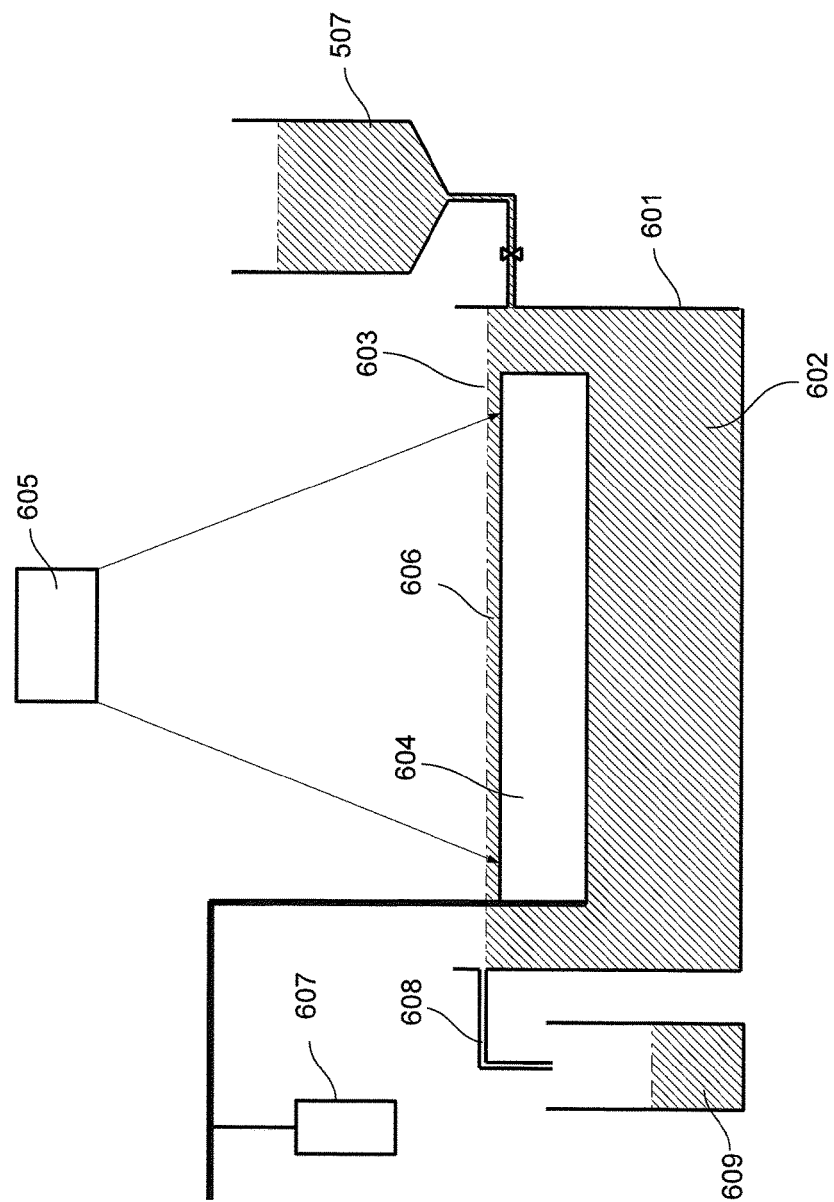
FIG. 6 shows a second alternative system suitable for three-dimensional printing.

According to an alternative embodiment of the stereolithographic apparatus, shown in FIG. 6 the exposure takes place not through the bottom of the vat with photocurable liquid, but from above.

The operation of this apparatus is slightly different from the one shown in FIG. 5. At the beginning of the process, the vat (601) is filled with the photocurable liquid (602) to a reference level (603). The manufacturing platform (604) is raised to a level just underneath the level (603) of the photocurable liquid (602). The distance is preferably between 0.5 mm and 1.0 mm. A first two-dimensional layer is created by illuminating using an illumination unit (605) the lowest of the ordered stack of two-dimensional images onto the layer (606) of photocurable liquid above the manufacturing platform (604). During this process, the photocurable liquid (606) polymerizes selectively in response to the information contained in the two-dimensional image.

In a next step the manufacturing table (604) is lowered by the motor (607) in the Z-dimension so that the distance between the layer that was formed in the previous step and platform and the level of photocurable liquid is again between 0.5 mm and 1.0 mm. The excess photocurable liquid (602) is thereby drained through a pipe (608) into a waste vat (609).

The previous step is followed by exposing the photocurable liquid (602) in response to the second lowest of the ordered stack of two-dimensional images so that a second layer is formed that adheres to the previous layer.

This process is repeated until the complete ordered set of layers has been formed at which point the relief print master is finished.

In a next and final step, the manufacturing platform (604) is raised and the relief print master is detached from it.

The advantage of this second apparatus is that illumination and exposure side effects that are related to the transparent bottom plate 502 in FIG. 5 are eliminated. A disadvantage is that a larger amount of photocurable liquid needs to be handled, leading potentially to more wasted liquid.

Illumination System

A number of illumination systems exist. They will be explained in combination with the apparatus in FIG. 5, but can just as well be used in combination with the apparatus in FIG. 6 if minor modifications are made to the geometry of the components.

Figure 7:
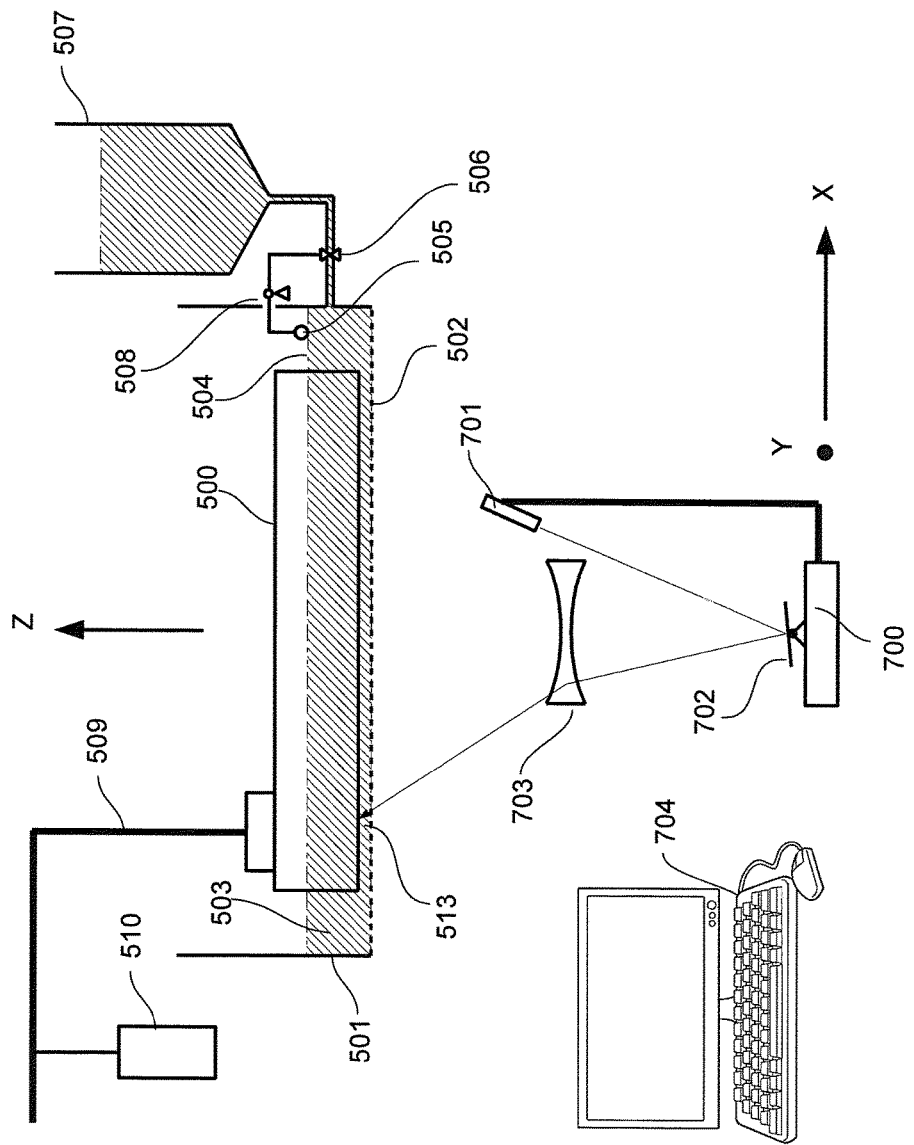
FIG. 7 shows an illumination system that uses a scanning laser beam.

FIG. 7 shows a first illumination system that comprises a table (700) that is moveable in the Y-dimension and on which a laser (701) is mounted which by means of a rotating mirror (702) scans in the X dimension. The laser is preferably an "optically-pumped" semiconductor laser that emits in the UV-A spectrum (315-400 nm) with a power output in the range of 200 mW to 2 W. The reflected laser beam is projected on the layer (513) with photocurable liquid just above the bottom plate (502) of the vat (501) by means of a projection lens system (703). The rotation of the mirror (702), the positioning of the table (700) and the modulation of the laser (701) are controlled by the computing device (704).

This illumination unit exposes the photocurable liquid column by column by scanning the laser beam in the X-dimension and line by line in the Y-dimension by moving the table in response to one out of the ordered set of two-dimensional images that is to be rendered.

Figure 8:
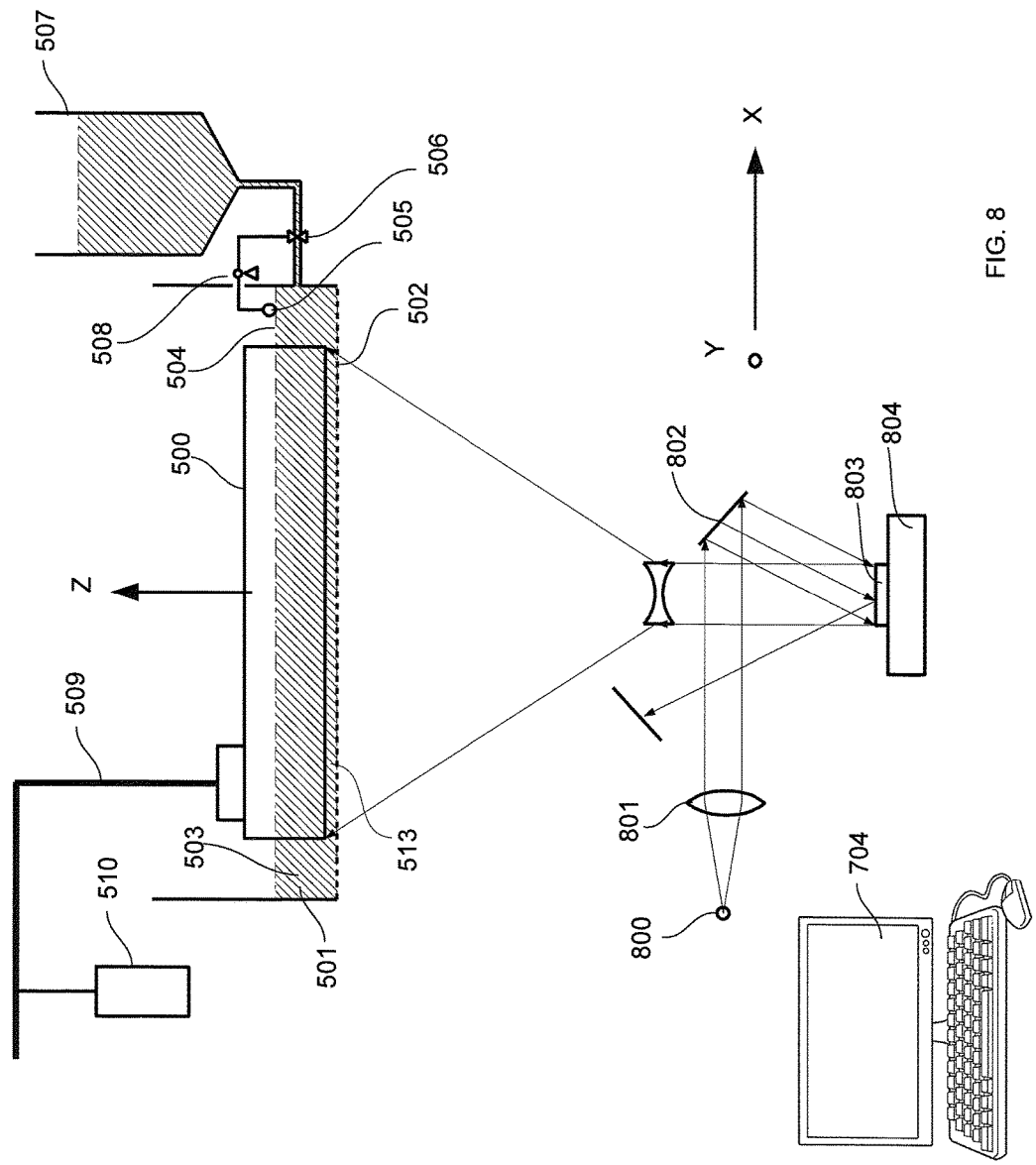
FIG. 8 shows an illumination system that uses a digital micro-mirror device.

A second example of an illumination system is shown in FIG. 8 and is based on the use of a digital micro-mirror device.

In this illumination system a light source such as a high pressure mercury vapour bulb (800) transmits light, preferably UV-A spectrum (315-400 nm), through a collimating lens system (801) on a fixed mirror (802). The mirror (802) reflects the collimated beam onto a digital micro-mirror device (803) mounted on a table (804). In response to one of the ordered set of two-dimensional images stored in the computing device (704), a light beam that impinges onto the micro-mirror device (803) is either reflected to an absorbing surface (806) or through a projection lens system (807) onto a layer (513) of the photocurable liquid just above the transparent bottom (502) of the vat (501). In this way the layer (513) of photocurable liquid is selectively polymerized in response to one out of the ordered set of two-dimensional images that is to be rendered. The advantage of this illumination system over the previous one is that it significantly reduces the mechanical complexity of the illumination system.

The digital micro-mirror device can optionally be mounted on a table (804) that can be translated in the X-Y dimensions. By translating the table in the X dimension in steps having a length of a sub-pixel size, for example a length that is half the size of a pixel, the resolution of the illumination system in the X-dimension can be doubled or more generally increased. The same principle can be used for increasing the resolution in the Y-dimension.

Figure 9:
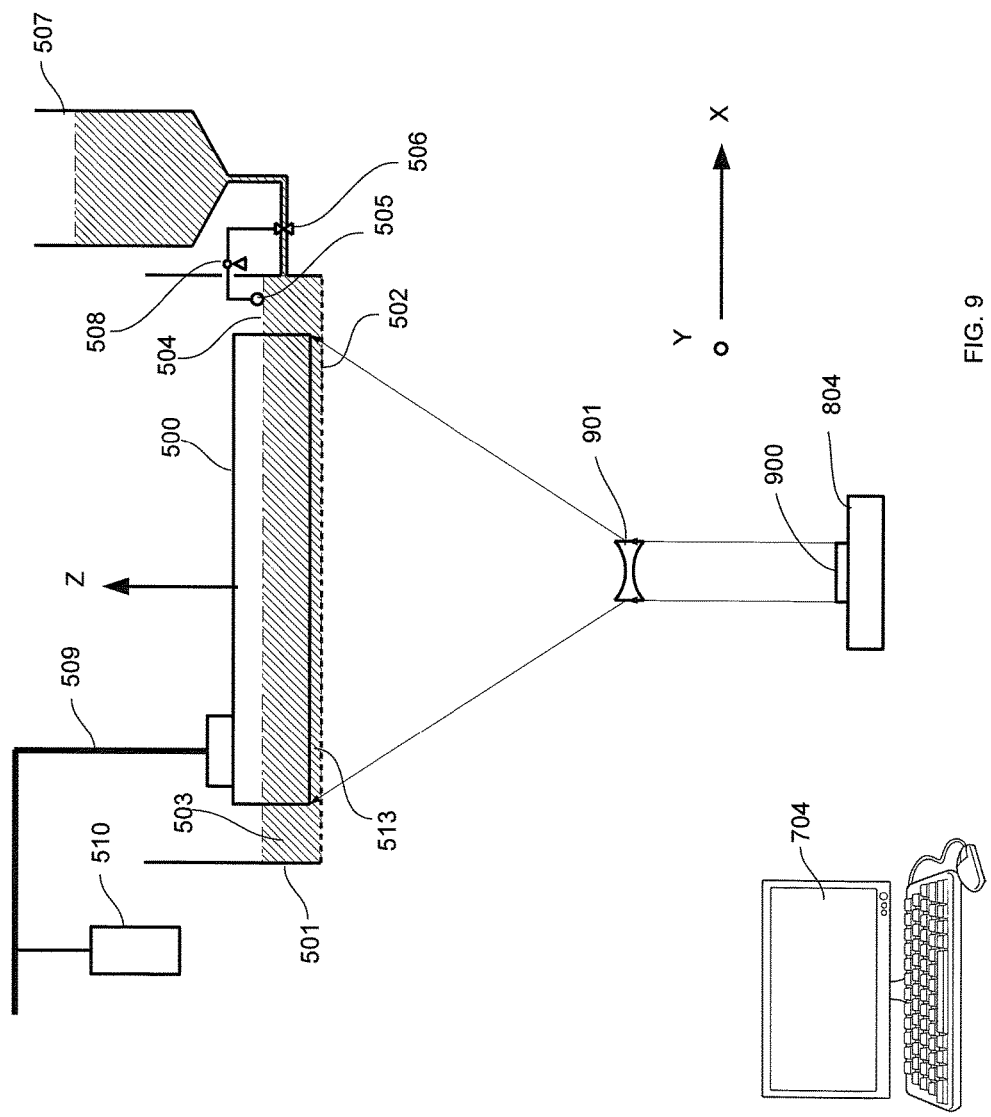
FIG. 9 shows an illumination system that uses a matrix of self-luminescent elements.

According to yet another embodiment shown in FIG. 9, the digital micro-mirror device in the illumination system is replaced by a self-luminescent panel (900). The panel (900) comprises a two-dimensional matrix of self-luminescent elements such as LED's that are driven to create a one out of an ordered set of two-dimensional images and projected through a projection lens system onto a layer (513) of photocurable liquid just above the transparent bottom (502) of the vat (501). This approach makes the need for an external light source, a collimation lens system and a fixed mirror obsolete. For increasing the resolution of the system, the same approach with a moveable table (804) in the X-Y dimensions can be used as explained in the embodiment shown in FIG. 8.

Figure 10:
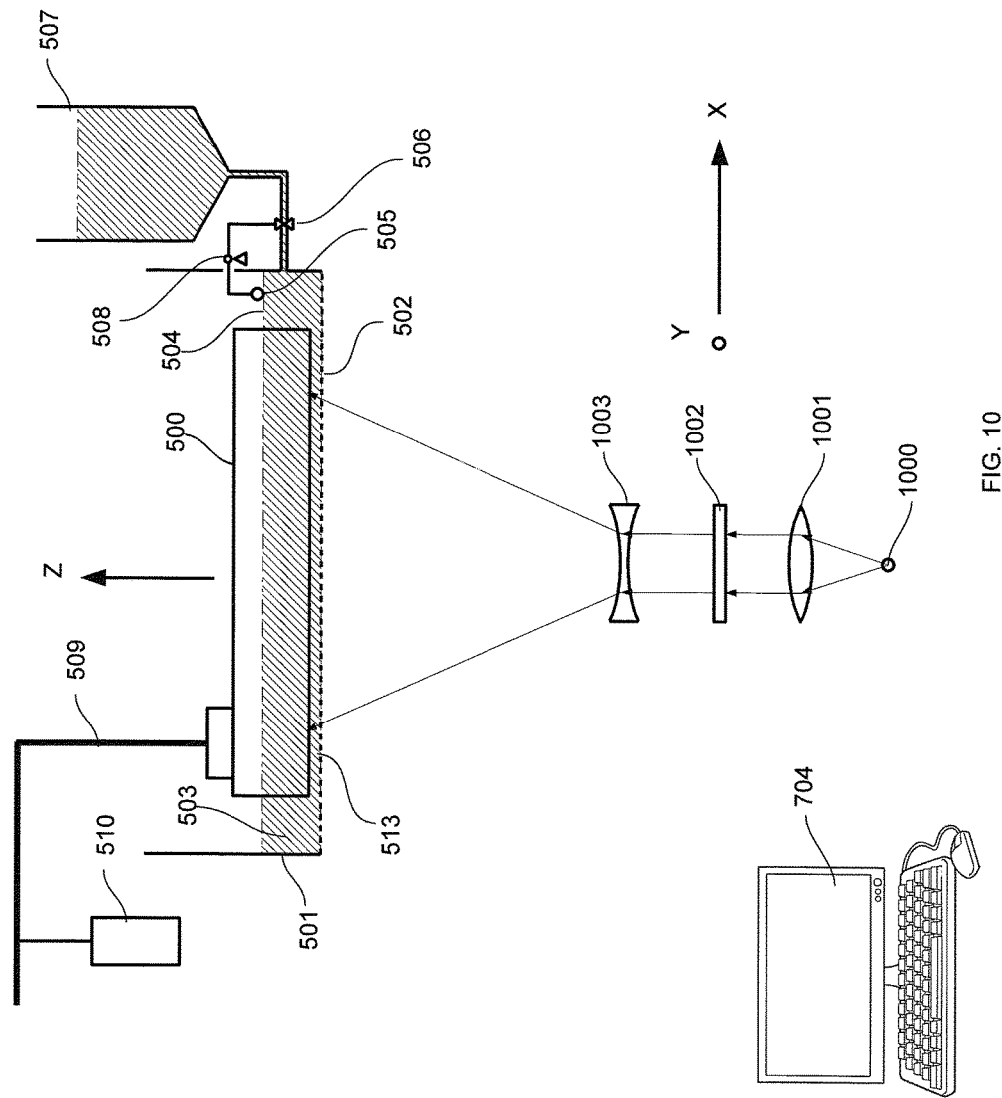
FIG. 10 shows a first illumination system that uses a matrix of light-valves.

Yet another embodiment is shown in FIG. 10. The light of a light source (1000) is collimated by a collimation lens system (1001) and passes through a two-dimensional panel (1002) with light valves, such as an LCD panel. The panel is driven to allow the transmittance of light as a function of one out of an ordered set of two-dimensional images. The resulting image is projected through a projection lens system (1003) onto a layer (513) of photocurable liquid just above the transparent bottom (502) of the vat (501).

Figure 11:
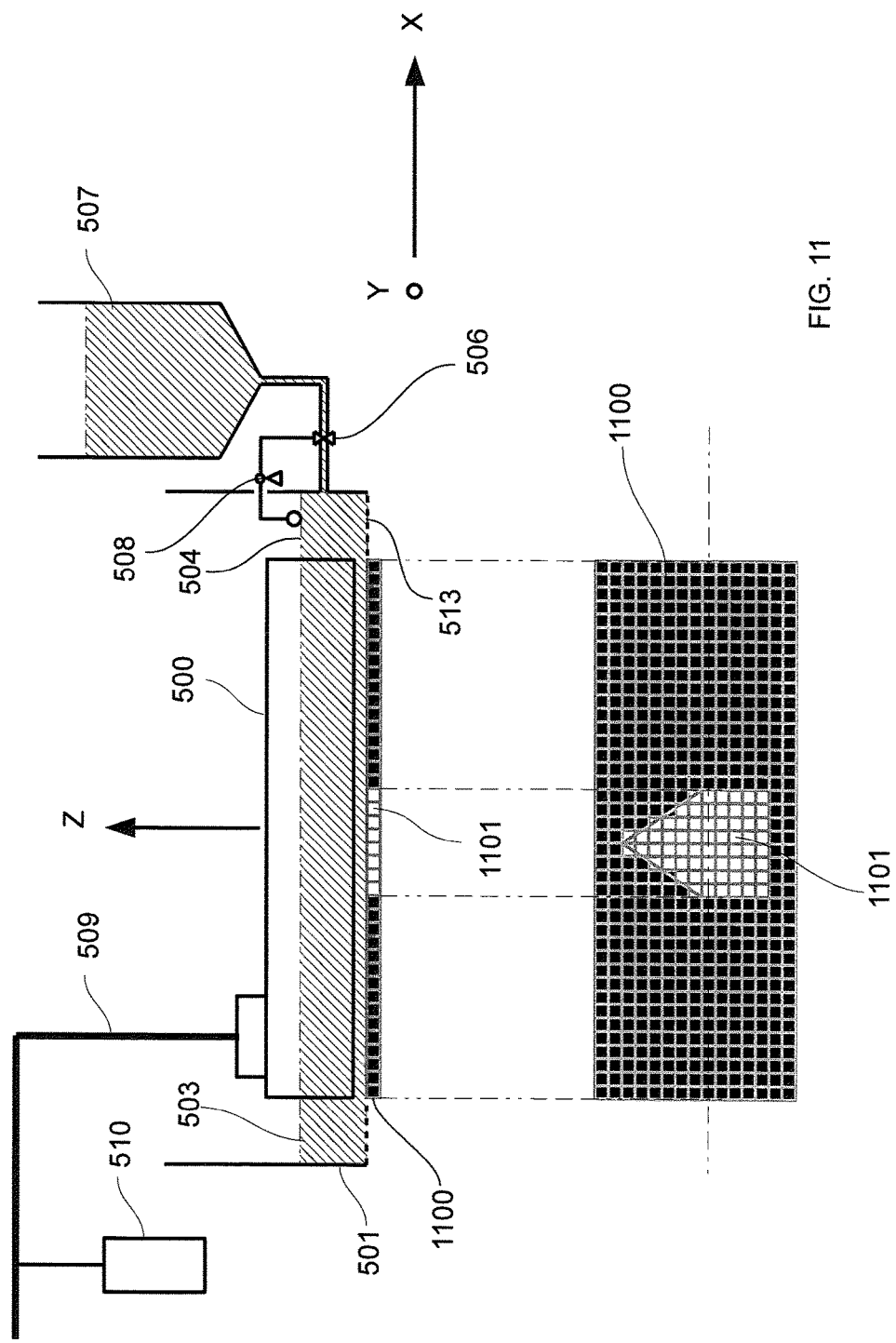
FIG. 11 shows a second illumination system that uses a matrix of light valves.

A variation of the embodiment in FIG. 10 is seen in FIG. 11. In this case the array of light valves (1100) is in direct contact with the transparent bottom of the (513) of the vat (501). A pixel in the array of light valves is designated by the sign (1101). Not shown in FIG. 11 are the optics to produce a collimated light beam underneath the array of light valves.

Composition of the Photocurable Liquid.

According to a preferred embodiment an photocurable liquid comprises
  a monofunctional (meth)acrylate monomer,
  a polyalkylene glycol di(meth)acrylate monomer of which the polyalkylene glycol chain has a MW of at least 300 and
  at least 1 wt. % of difunctional (meth)acrylate monomer according to Formula I or II,

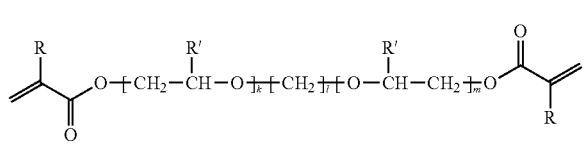

Formula I

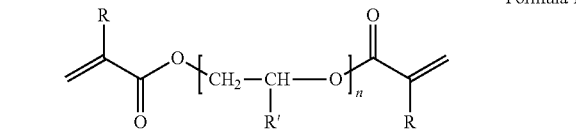

Formula II k and m in formula I is an integer ranging from 0 to 5,
l in Formula I is an integer ranging from 1 to 20
n in Formula II is 1, 2, 3 or 4,
R is H or CH3, and
R' is H or an alkyl group.

Preferably:
  the amount of the difunctional (meth)acrylate monomer according to Formula I or II is at least 5 wt. %;
  the polyalkylene glycol diacrylate monomer has a MW of at least 400;
  the photocurable fluid has a viscosity measured at operational temperature that is less than 15 mPa·s;
  the polyalkylene glycol di(meth)acrylate monomer is a polyethylene glycol di(meth)acrylate monomer;
  the monofunctional (meth)acrylate monomer is a cyclic (meth)acrylate monomer, wherein the cyclic monofunctional (meth)acrylate monomer is isobornyl acrylate or 4-t.butyl cyclohexyl acrylate;
  the monofunctional urethane acrylate oligomer is an aliphatic urethane acrylate;
  the initiator is a photo-initiator.

More information and examples of compositions are found in the publication EP 2537675 B (AGFA GRAPHICS NV) 21 Dec. 2013.

Cavities

According to a preferred embodiment of the current invention a relief print master comprises cavities.

In the present invention, cavities are defined as volumetric entities in the flexographic printing plate whereby the degree of polymerization of the monomeric units in that volumetric entity is less than 25 percent. More preferably, the degree of polymerization is between 0 and 5 percent. Most preferably, between 0 and 2 percent.

Figure 12:
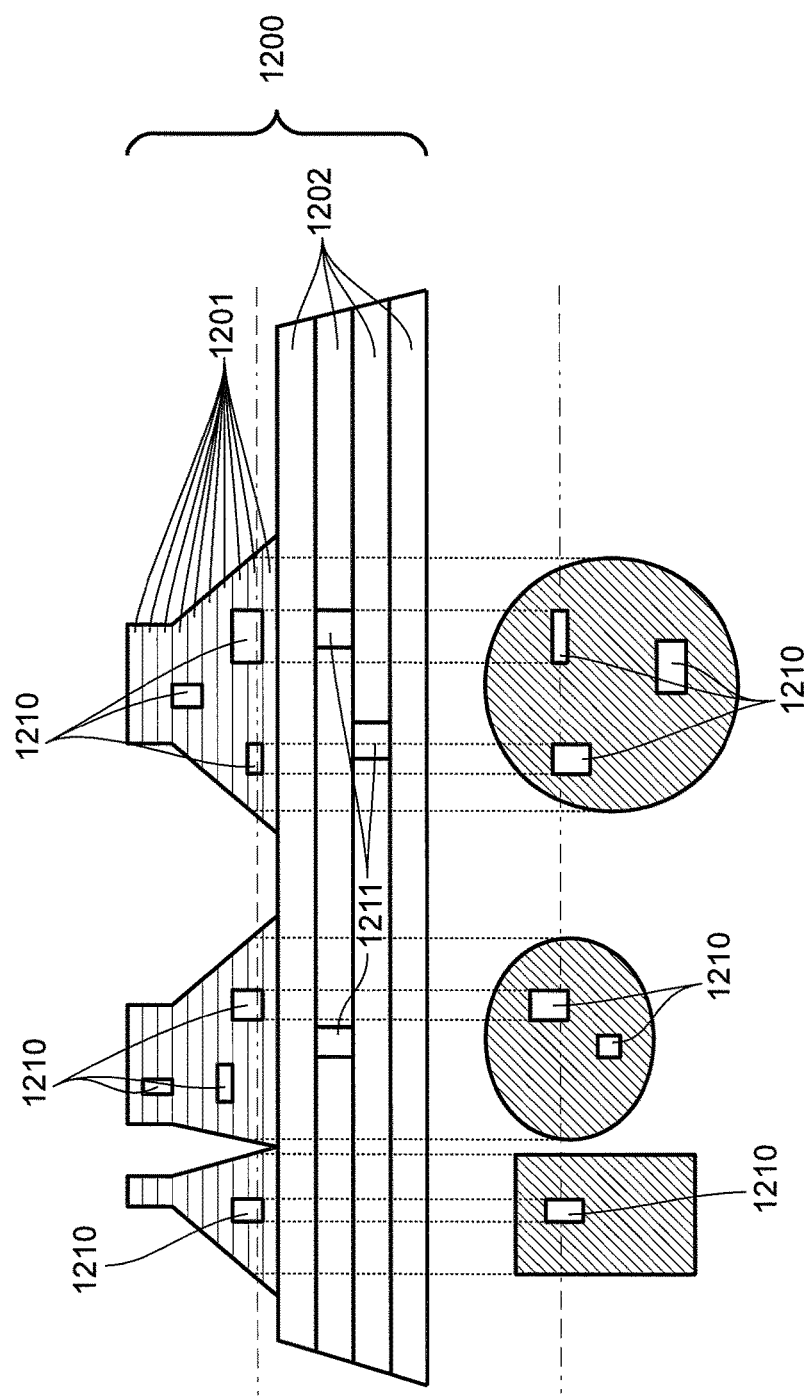
FIG. 12 shows cross sections in the X-Z dimensions and the X-Y dimensions of a relief print master that comprises cavities.

FIG. 12 shows a relief print master (1200) that comprises a stack of layers (1201 and 1202). The upper stack of layers 1200 defines the image features, the lower stack 1202 is a flexible support table, ("mesa layer") that supports the layers 1201 defining said image features.

Within the relief print master reside cavities (1210 and 1211). Their size, number and distribution enables to control the compressibility of the relief print master. They are introduced in the three-dimensional representation and rendered during the reconstruction of the relief print master (1200). According to an aspect of the current invention, the cavities (1210 and 1211) can be present in the upper layers 1201 defining the image features or in the lower layers 1202 defining a mesa layer, or in both. Preferably the cavities are located in the mesa layer of the flexographic printing plate.

It is object of the present invention that the cavities (1210, 1211) according to present invention are calculated as a function of the image features in the relief layer and are independently located in either the mesa layer, the relief layer or a combination thereof. More preferably the cavities are located in the mesa layer of the flexographic printing plate.

The following method is a preferred embodiment for carrying out the invention. The method is first explained in a very simplified way for purely didactic purposes by means of FIG. 14.

Figure 14:
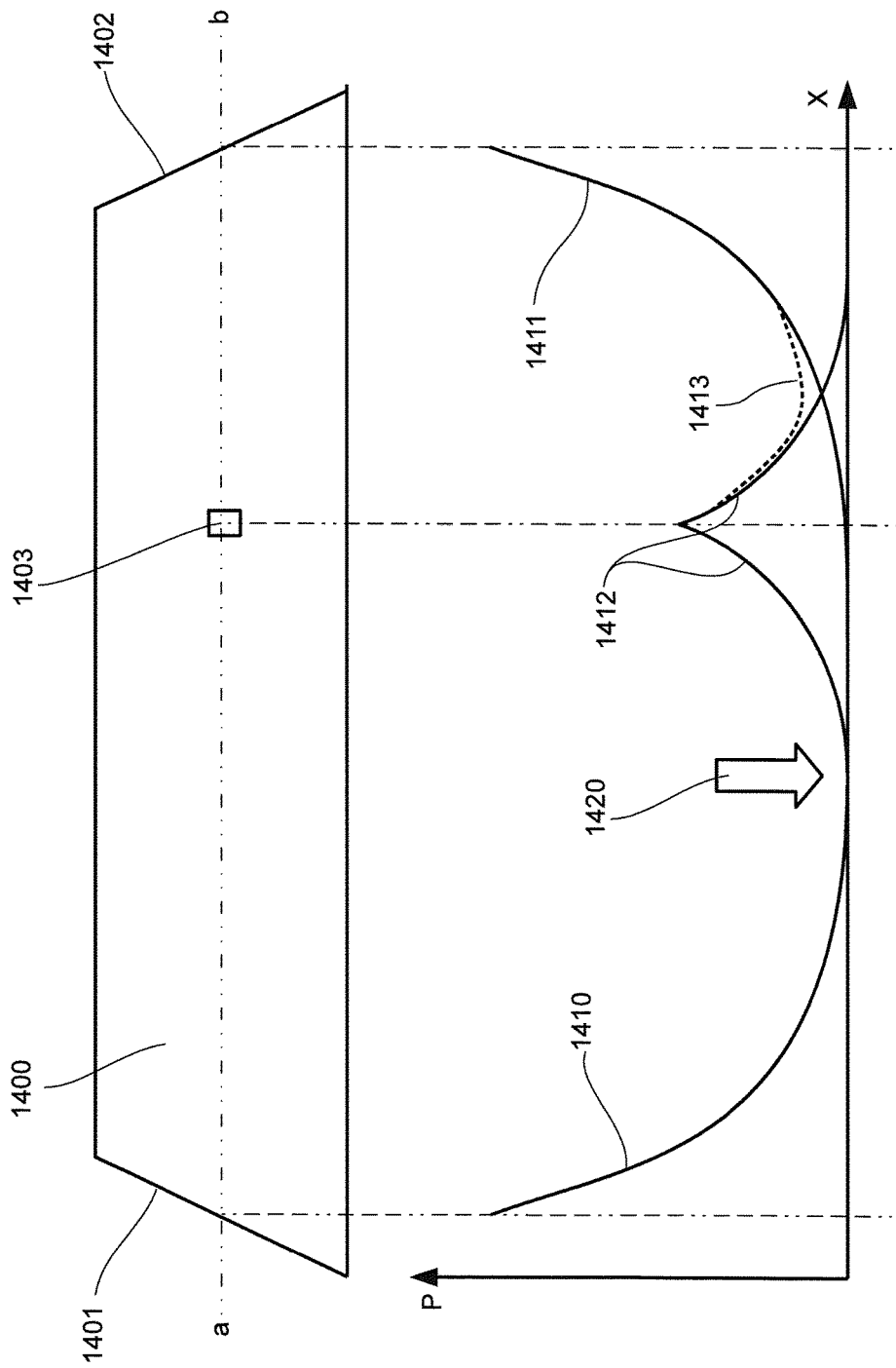
FIG. 14 shows a cross section of an image feature with a cavity inside it and a potential field that corresponds with it.

In the upper part of FIG. 14 is shown a cross section in the XY plane of an image feature 1400 in the three-dimensional representation of a relief print master. The image feature may be a large halftone dot or a solid tint. It is delineated by two boundaries 1401 and 1402. Inside the image feature 1400 there is a single cavity 1403. Also shown is the location of a cross section ab through the XY plane and parallel to the X-dimension that passes through said cavity 1403.

The lower part of FIG. 14 shows the value of a potential field P along the cross section ab. To the boundaries 1401 and 1402 a potential is assigned that causes a potential field 1410 and 1411. The potential field decreases as a function of the distance from the boundaries 1410 and 1411. Also to the cavity 1403 a potential is assigned that causes a potential field 1412. This latter potential and the potential field that is associated with is chosen to be lower than the potentials 1410 and 1411 that are assigned to the boundaries 1401 and 1402. The dotted line 1413 represents the sum of all the potential fields. The sum of all the potential fields has a minimum indicated by the arrow 1420 and according to the method in the current invention this position is selected as the optimal candidate for a next cavity.

The method that is supported by FIG. 14 works as follows. By controlling the ratio of the value of the electrical charge that is assigned to the boundaries over the value of the charge that is assigned to a cavity, it is possible to control the distance from the boundaries 1401 and 1402 from which a position for a cavity is selected. High values for this ratio will exert a stronger repulsive force and will decrease the chance that the minimum of the sum of all potential fields is located nearby the boundaries 1410 and 1411. According to a second aspect of the method, the assignment of a charge to a location of a first cavity will exert a repulsive force that increases the sum of all potential fields in its neighbourhood and reduce the chance that in a next step a location is selected for a second cavity that is nearby said first cavity. This has the effect that the cavities will be assigned to locations that are uniformly distributed along the cross section ab.

Figure 13:
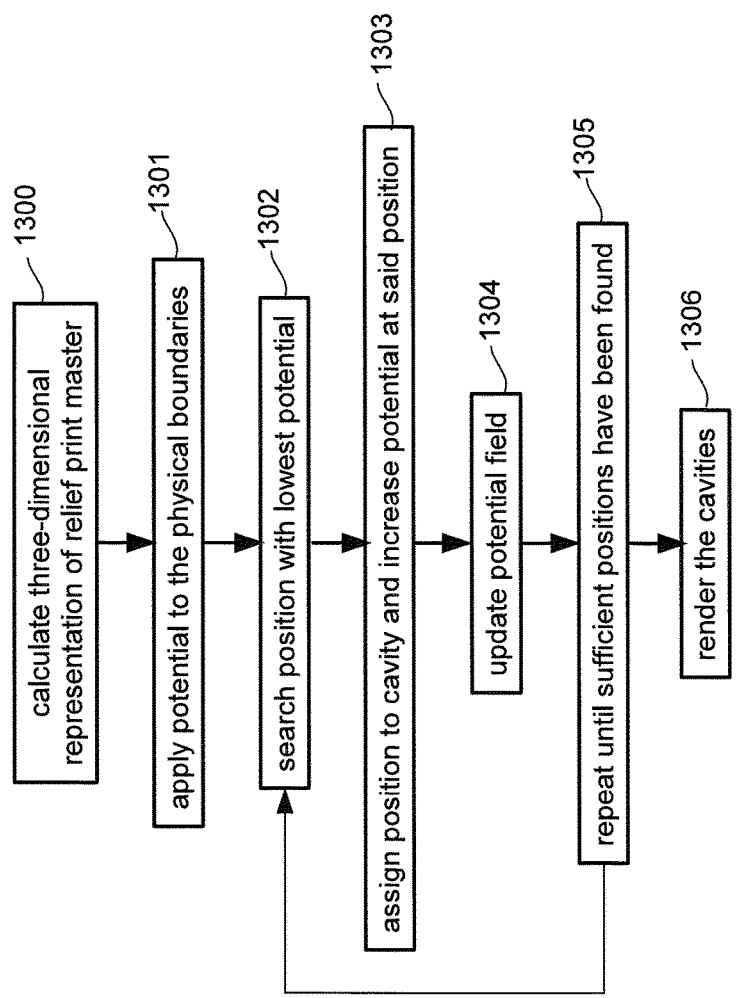
FIG. 13 shows a flowchart of a method according to a preferred embodiment of the current invention.

With reference to FIG. 13, a method according to the current invention can be explained as follows.

In a first step the position of the cavities (1210) is determined within the three-dimensional representation of the relief print master (1200) using a three-dimensional potential field. Similarly as with an electrical field, the strength of such a potential field diminishes as a function of the distance between its source and an object on which it is exerted. In what follows and in the claim set, it is assumed that a potential exerts a repulsive force, like for example the repulsive force that exists between two objects that are electrically charged with same electrical polarity.

The algorithm starts with the calculation (1300) of the three-dimensional representation of the relief print master (1200) using one of the prior art methods.

In a following step a potential is assigned (1301) to the voxels that correspond with the physical boundaries of the relief print master. Next the position is searched (1302) where the potential field has its lowest value inside the three-dimensional representation of the relief print master (1200). This determines (1303) a first position for a cavity. At that position the potential is raised, thereby changing the potential field (1304). A second position is found by searching again where the potential field has its lowest value. This process can be continued until a sufficient number of positions for cavities have been found (1305). The use of the potential field that exerts a repulsive force results in a homogenous distribution of the positions for cavities by inhibiting that a second position for a cavity is selected in the immediate neighbourhood of a position for a first cavity. It also enables to avoid that positions for cavities are selected that lie nearby the physical boundary of the relief print master. It also automatically reduces the number of positions for cavities in areas that correspond with small image features such as halftone dots or the stems of small text. By controlling the strength of the potential that is assigned to the voxels nearby the boundaries, it is possible steer this effect.

Once the positions of the cavities have been determined, a second step comprises rendering (1206) the cavities themselves, by inverting the values of the voxels nearby the selected positions in the three-dimensional representation of the relief print plate so that printing voxels are converted into a non-printing voxels during the reconstruction.

Extraction

Preferably, the cavities according to the present invention do not contain any unreacted photocurable liquid prior to use as a printing plate. Trapped unreacted liquid in the image-wise created cavities (located in the relief layer of the flexographic printing plate) can be removed by equilibrium swelling of the relief layer in a solvent in which said unreacted liquid can be dissolved, followed by a drying step.

Figure 15:
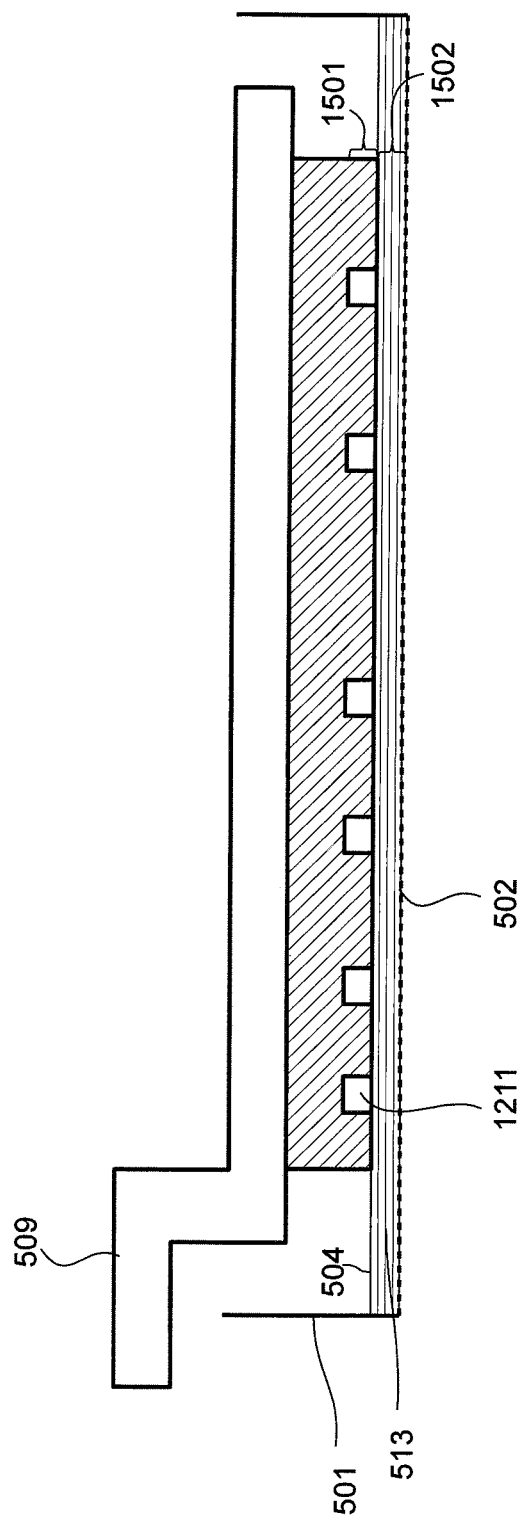
FIG. 15 shows an embodiment of the current invention wherein the photocurable liquid is at the same level as a layer that is to be exposed.

In another embodiment of the present invention, the photocurable liquid height for layers following layers that contain image-wise created cavities is limited to the construction height of said layer. This illustrated by means of FIG. 15. The level (504) of the photocurable liquid (513) is set just below a layer (1501) that was created in a previous step and just above a layer 1502 that is to be created in a next step;

Other Embodiments

A number of variations exist on the above method.

It was found, for example, that the exact shape of the potential field associated with a potential is not critical, as long as it is monotonically declining as a function of distance. It can decrease according to a second or a third power of the distance. It is also allowed to have (the three-dimensional equivalent) of a bell-shape.

It is possible to use a random element for the value of the potential that is assigned to a selected location for a cavity.

This will randomize the locations that are selected for the cavities and also avoid that "equivalent" candidate positions exist for selecting a next position for a cavity.

It is also possible to create cavities that have all the same shape and size with the above method, or alternatively to introduce variation in their shape and size.

The invention claimed is:
1. A method for constructing a relief print master including a relief layer defining image features, the method comprising the steps of:
    calculating a three-dimensional representation of the relief print master including a plurality of voxels each having a value that indicates where a stereolithographic apparatus is to print material and is not to print material;
    printing the relief print master with the stereolithographic apparatus in accordance with the three-dimensional representation by:
        supplying a photocurable liquid;
        imagewise exposing a layer of the photocurable liquid to selectively polymerize the layer;
        repeating the supplying and imagewise exposing steps until the relief print master is completed;
    selecting positions inside the three-dimensional representation of the relief print master as a function of the image features in the relief layer to introduce cavities defining volumetric entities in the relief print master in which a degree of polymerization of monomeric units in each of the volumetric entities is less than 25 percent; and
    changing the values of voxels of the plurality of voxels at or near the selected positions to introduce the cavities inside the relief print master.
2. The method according to claim 1, wherein the stereolithographic apparatus includes an illumination system for the step of imagewise exposing, and the illumination system includes a laser.
3. The method according to claim 2, wherein the laser is an optically-pumped semiconductor laser that emits in the UV-A spectrum with a power output in a range of 200 mW to 2 C.
4. The method according to claim 1, wherein the stereolithographic apparatus includes an illumination system for the step of imagewise exposing, and the illumination system includes a high pressure mercury vapour bulb transmitting the UV-A spectrum through a collimating lens system on a fixed mirror, which reflects the UV-A spectrum onto a digital micro-mirror device.
5. The method according to claim 1, wherein the photocurable liquid includes:
    a monofunctional (meth)acrylate monomer;
    a polyalkylene glycol di(meth)acrylate monomer of which a polyalkylene glycol chain has a MW of at least 300; and
    at least 1 wt. % of difunctional (meth)acrylate monomer according to Formula I or II:

Formula I
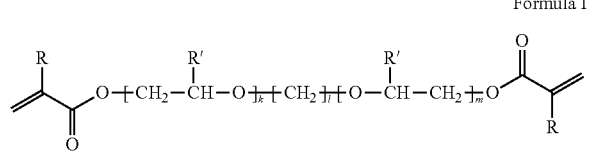

Formula II
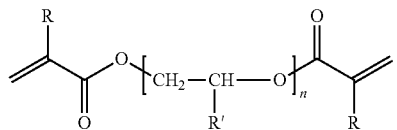

wherein
k and m in formula I is an integer ranging from 0 to 5;
l in Formula I is an integer ranging from 1 to 20;
n in Formula II is 1, 2, 3, or 4;
R is H or $CH_3$; and
R' is H or an alkyl group.
6. The method according to claim 5, wherein an amount of the difunctional (meth)acrylate monomer according to Formula I or II is at least 5 wt. %.
7. The method according to claim 5, wherein the photocurable fluid has a viscosity measured at an operational temperature that is less than 15 mPa·s.
8. The method according to claim 1, wherein the degree of polymerization of the monomeric units in the volumetric entity is less than 5 percent.
9. The method according to claim 1, further comprising the step of:
    providing a stack of layers including a lower stack of layers that support an upper stack of layers defining the images features of the relief print master; wherein
    the relief layer defining the image features is a layer in the upper stack of layers.
10. The method according to claim 1, wherein the step of selecting the position of the cavities includes the steps of:
    a) selecting a position of a first cavity inside the three-dimensional representation of the relief print master;
    b) raising a potential at the selected position of the cavity to create a potential field that exerts a repulsive force between the selected position of the cavity and other positions inside the three-dimensional representation of the relief print master, the repulsive force diminishing as a function of a distance between the selected position and the other positions;
    c) updating a value of the potential field inside the three-dimensional representation of the relief print master;
    d) searching for a location of a local minimum of the potential field inside the three-dimensional representation of the relief print master;
    e) selecting the location of a second cavity inside the three-dimensional representation of the relief print master; and
    f) repeating the steps b) to e) until a number of the selected positions of the cavities has reached a predetermined threshold.
11. A system for creating a relief print master including a relief layer defining image features, the system comprising:
    a first calculator that calculates a three-dimensional representation of the print-relief master including a plurality of voxels each having a value that indicates where to print material and where not to print material;
    a stereolithographic apparatus that prints the relief print master in accordance with the three-dimensional representation, the stereolithographic apparatus including a supplier of photocurable liquid, and an illumination system to imagewise expose and selectively polymerize layers of the photocurable liquid;

a second calculator that selects positions inside the three-dimensional representation of the relief print master as a function of the image features in the relief layer to introduce cavities, and to change the values of voxels of the plurality of voxels at or near the selected position to introduce the cavities inside the relief print master; wherein the cavities are defined as volumetric entities in the relief print master in which a degree of polymerization of monomeric units in each of the volumetric entities is less than 25 percent.

12. The system according to claim 11, wherein the illumination system includes a laser.

13. The system according to claim 12, wherein the photocurable liquid includes:
   a monofunctional (meth)acrylate monomer;
   a polyalkylene glycol di(meth)acrylate monomer of which a polyalkylene glycol chain has a MW of at least 300; and
   at least 1 wt. % of difunctional (meth)acrylate monomer according to Formula I or II:

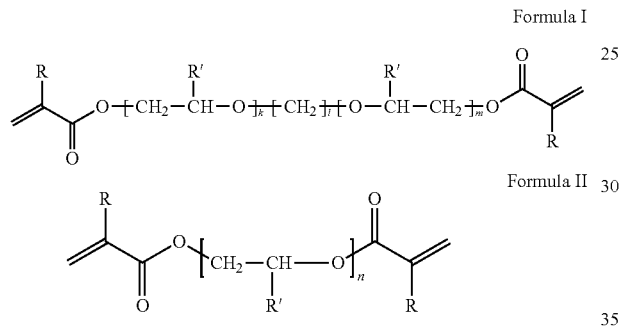

Formula I

Formula II wherein
   k and m in formula I is an integer ranging from 0 to 5;
   l in Formula I is an integer ranging from 1 to 20;
   n in Formula II is 1, 2, 3, or 4;
   R is H or $CH_3$; and
   R' is H or an alkyl group.

14. The system according to claim 13, wherein an amount of the difunctional (meth)acrylate monomer according to Formula I or II is at least 5 wt. %.

15. A system for creating a relief print master including a relief layer defining image features and a stack of layers that support the image features, the system comprising:
   a first calculator that calculates a three-dimensional representation of the relief print master including a plurality of voxels each having a value that indicates where to print material and where not to print material;
   a stereolithographic apparatus that prints the relief print master in accordance with the three-dimensional representation, the stereolithographic apparatus including a supplier of photocurable liquid, an illumination system to imagewise expose and selectively polymerize layers of the photocurable liquid;
   a second calculator that selects positions inside the three-dimensional representation of the relief print master as a function of the image features in the relief layer to introduce cavities, and to change the values of voxels of the plurality of voxels at or near the selected positions to introduce the cavities inside the stack of layers; wherein
   the cavities are defined as volumetric entities in the relief print master in which a degree of polymerization of monomeric units in each of the volumetric entities is less than 25 percent.

* * * * *